(12) United States Patent
Aleksov et al.

(10) Patent No.: US 11,257,745 B2
(45) Date of Patent: Feb. 22, 2022

(54) ELECTROLESS METAL-DEFINED THIN PAD FIRST LEVEL INTERCONNECTS FOR LITHOGRAPHICALLY DEFINED VIAS

(71) Applicant: INTEL CORPORATION, Santa Clara, CA (US)

(72) Inventors: Aleksandar Aleksov, Chandler, AZ (US); Veronica Strong, Chandler, AZ (US); Kristof Darmawikarta, Chandler, AZ (US); Arnab Sarkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,219

(22) PCT Filed: Sep. 29, 2017

(86) PCT No.: PCT/US2017/054638
§ 371 (c)(1),
(2) Date: Feb. 21, 2020

(87) PCT Pub. No.: WO2019/066977
PCT Pub. Date: Apr. 4, 2019

(65) Prior Publication Data
US 2020/0258827 A1 Aug. 13, 2020

(51) Int. Cl.
*H05K 1/00* (2006.01)
*H05K 1/03* (2006.01)
(Continued)

(52) U.S. Cl.
CPC ...... *H01L 23/49827* (2013.01); *H01L 21/486* (2013.01); *H01L 23/49866* (2013.01);
(Continued)

(58) Field of Classification Search
CPC .. H05K 1/00; H05K 1/03; H05K 1/09; H05K 1/11; H05K 1/18; H05K 3/02; H05K 3/10;
(Continued)

(56) References Cited

U.S. PATENT DOCUMENTS

| 5,442,239 | A | * | 8/1995 | DiGiacomo | ........ | H01L 21/4853 |
| | | | | | | 257/766 |
| 6,573,537 | B1 | * | 6/2003 | Steigerwald | .......... | H01L 33/405 |
| | | | | | | 257/103 |

(Continued)

FOREIGN PATENT DOCUMENTS

KR 2008-0051093 6/2008

OTHER PUBLICATIONS

International Search Report and Written Opinion for International Patent Application No. PCT/US17/54638, dated Jun. 28, 2018.
(Continued)

*Primary Examiner* — Xiaoliang Chen
(74) *Attorney, Agent, or Firm* — Essential Patents Group, LLP.

(57) ABSTRACT

A package substrate, comprising a package comprising a substrate, the substrate comprising a dielectric layer, a via extending to a top surface of the dielectric layer; and a bond pad stack having a central axis and extending laterally from the via over the first layer. The bond pad stack is structurally integral with the via, wherein the bond pad stack comprises a first layer comprising a first metal disposed on the top of the via and extends laterally from the top of the via over the top surface of the dielectric layer adjacent to the via. The first layer is bonded to the top of the via and the dielectric layer, and a second layer is disposed over the first layer. A third layer is disposed over the second layer. The second layer comprises a second metal and the third layer comprises
(Continued)

a third metal. The second layer and the third layer are electrically coupled to the via.

11 Claims, 8 Drawing Sheets

(51) Int. Cl.

| | | |
|---|---|---|
| H05K 1/09 | (2006.01) | |
| H05K 1/11 | (2006.01) | |
| H05K 1/18 | (2006.01) | |
| H05K 3/02 | (2006.01) | |
| H05K 3/10 | (2006.01) | |
| H05K 3/40 | (2006.01) | |
| H05K 3/46 | (2006.01) | |
| H01L 21/00 | (2006.01) | |
| H01L 21/02 | (2006.01) | |
| H01L 21/31 | (2006.01) | |
| H01L 21/44 | (2006.01) | |
| H01L 21/48 | (2006.01) | |
| H01L 21/56 | (2006.01) | |
| H01L 21/66 | (2006.01) | |
| H01L 21/70 | (2006.01) | |
| H01L 21/469 | (2006.01) | |
| H01L 21/4763 | (2006.01) | |
| H01L 21/8246 | (2006.01) | |
| H01L 23/00 | (2006.01) | |
| H01L 23/28 | (2006.01) | |
| H01L 23/31 | (2006.01) | |
| H01L 23/48 | (2006.01) | |
| H01L 23/52 | (2006.01) | |
| H01L 23/58 | (2006.01) | |
| H01L 23/485 | (2006.01) | |
| H01L 23/495 | (2006.01) | |
| H01L 23/498 | (2006.01) | |
| H01L 23/522 | (2006.01) | |
| G06K 19/02 | (2006.01) | |
| G06K 19/077 | (2006.01) | |
| H05K 3/18 | (2006.01) | |

(52) U.S. Cl.
CPC ............ *H05K 1/113* (2013.01); *H05K 3/184* (2013.01); *H05K 2201/0379* (2013.01); *H05K 2203/0565* (2013.01)

(58) Field of Classification Search
CPC . H05K 3/40; H05K 3/46; H01L 21/00; H01L 21/02; H01L 21/31; H01L 21/44; H01L 21/48; H01L 21/56; H01L 21/66; H01L 21/70; H01L 21/469; H01L 21/4763; H01L 21/8246; H01L 23/00; H01L 23/28; H01L 23/31; H01L 23/48; H01L 23/52; H01L 23/58; H01L 23/485; H01L 23/495; H01L 23/498; H01L 23/522; G06K 19/02; G06K 19/077
USPC ..... 361/748, 760, 767; 174/126.2, 250, 255, 174/257, 258, 262; 438/3, 27, 29, 31, 33, 438/106, 332, 612, 613, 614, 624, 639, 438/119, 125; 257/48, 98, 103, 310, 472, 257/532, 734, 737, 751, 758, 762, 774, 257/777, 780; 428/18; 216/13, 83, 125; 310/344; 235/488, 492
See application file for complete search history.

(56) References Cited

U.S. PATENT DOCUMENTS

| | | | | |
|---|---|---|---|---|
| 8,148,257 B1* | 4/2012 | Barth | ............... | H01L 21/76879 438/614 |
| 8,198,729 B2* | 6/2012 | Chou | ................. | H01L 23/5227 257/758 |
| 8,440,272 B2* | 5/2013 | Lin | ....................... | H01L 24/05 428/18 |
| 8,836,146 B2* | 9/2014 | Chou | .................... | H01L 24/12 257/780 |
| 10,818,620 B2* | 10/2020 | Shigihara | ............ | H01L 23/485 |
| 2003/0102563 A1 | 6/2003 | Mercado | ............ | H01L 23/3171 257/762 |
| 2003/0227046 A1* | 12/2003 | Ando | ............... | H01L 27/11502 257/310 |
| 2004/0029298 A1* | 2/2004 | Casagrande | ...... | H01L 27/11502 438/3 |
| 2004/0227237 A1* | 11/2004 | Ueda | ....................... | H01L 24/48 257/734 |
| 2005/0280112 A1* | 12/2005 | Abbott | ................... | H01L 24/05 257/472 |
| 2007/0111516 A1* | 5/2007 | Abbott | ................... | H01L 24/05 438/624 |
| 2007/0132105 A1* | 6/2007 | Akram | ................ | C23C 18/1637 257/774 |
| 2007/0164279 A1* | 7/2007 | Lin | ........................ | H01L 24/05 257/48 |
| 2007/0205520 A1* | 9/2007 | Chou | .................... | H01L 24/48 257/780 |
| 2007/0246744 A1* | 10/2007 | Chen | .................... | H05K 3/4682 257/211 |
| 2007/0262341 A1* | 11/2007 | Liu | ........................ | H01L 24/32 257/103 |
| 2007/0275503 A1* | 11/2007 | Lin | ........................ | H01L 24/83 438/106 |
| 2008/0014437 A1* | 1/2008 | Dangelmaier | .... | H01L 23/49582 428/332 |
| 2008/0042280 A1* | 2/2008 | Lin | ........................ | H01L 24/06 257/751 |
| 2008/0054457 A1* | 3/2008 | Lin | ....................... | H01L 21/563 257/737 |
| 2008/0149383 A1* | 6/2008 | Kaneko | ............ | H01L 23/49822 174/262 |
| 2008/0251940 A1* | 10/2008 | Lee | ....................... | H01L 24/86 257/777 |
| 2008/0308297 A1* | 12/2008 | Jurenka | ................ | H01L 24/05 174/126.2 |
| 2008/0316721 A1* | 12/2008 | Maki | .................... | H05K 3/244 361/760 |
| 2010/0084163 A1* | 4/2010 | Kodani | .................. | H05K 3/10 174/250 |
| 2010/0181659 A1* | 7/2010 | Hanson | .................. | H01L 24/32 257/676 |
| 2010/0200898 A1* | 8/2010 | Lin | .................. | H01L 27/14621 257/294 |
| 2010/0301452 A1* | 12/2010 | Wang | .................. | H01L 23/5223 257/532 |
| 2011/0189848 A1* | 8/2011 | Ewert | ..................... | C25D 5/022 438/612 |
| 2012/0098139 A1* | 4/2012 | Chae | ..................... | H01L 29/7926 257/773 |
| 2012/0153484 A1* | 6/2012 | Sadaka | ............ | H01L 21/76886 257/762 |
| 2012/0222894 A1* | 9/2012 | Kaneko | ............ | H01L 23/49811 174/257 |
| 2013/0170013 A1* | 7/2013 | Tonar | ...................... | G02F 1/157 359/296 |
| 2013/0264720 A1* | 10/2013 | Chun | .................. | H01L 24/03 257/774 |
| 2013/0328212 A1* | 12/2013 | Chino | .................. | H01L 21/568 257/774 |
| 2014/0002188 A1* | 1/2014 | Chen | ..................... | H01L 23/481 330/250 |

(56) References Cited

U.S. PATENT DOCUMENTS

| | | | |
|---|---|---|---|
| 2014/0070426 A1* | 3/2014 | Park | H01L 23/481 257/774 |
| 2014/0327150 A1* | 11/2014 | Jung | H01L 23/291 257/774 |
| 2014/0346930 A1* | 11/2014 | Kohda | H03H 9/1021 310/344 |
| 2015/0044848 A1* | 2/2015 | Bonifield | H01L 21/76877 438/381 |
| 2015/0084084 A1* | 3/2015 | Chae | H01L 33/46 257/98 |
| 2015/0092371 A1* | 4/2015 | Meinhold | H05K 1/111 361/767 |
| 2015/0140710 A1* | 5/2015 | McLaurin | H01S 5/32025 438/31 |
| 2015/0171039 A1* | 6/2015 | Cheng | H01L 24/742 257/737 |
| 2015/0229108 A1* | 8/2015 | Steigerwald | H01S 5/0215 372/45.01 |
| 2016/0044786 A1* | 2/2016 | Swaminathan | H01L 24/13 174/257 |
| 2016/0118554 A1* | 4/2016 | Akram | H01L 33/60 438/27 |
| 2016/0295692 A1* | 10/2016 | Asano | H05K 1/113 |
| 2017/0005048 A1* | 1/2017 | Shigihara | H01L 24/06 |
| 2017/0053960 A1* | 2/2017 | Wakiyama | H01L 27/1469 |
| 2017/0103946 A1* | 4/2017 | Chang | H01L 21/486 |
| 2017/0125365 A1* | 5/2017 | Cheng | H01L 24/03 |
| 2017/0221814 A1* | 8/2017 | Kinoshita | H01L 23/5226 |
| 2017/0271242 A1* | 9/2017 | Lo | H01L 21/76898 |
| 2017/0294398 A1* | 10/2017 | Happoya | H01L 23/49816 |
| 2017/0294408 A1* | 10/2017 | Happoya | H01L 24/06 |
| 2017/0317017 A1* | 11/2017 | Ishihara | H05K 1/181 |
| 2018/0204734 A1* | 7/2018 | Meier | C01G 55/00 |
| 2020/0105940 A1* | 4/2020 | Majhi | H01L 29/66757 |
| 2020/0144293 A1* | 5/2020 | Majhi | H01L 29/24 |

OTHER PUBLICATIONS

International Preliminary Report on Patentability for PCT Application No. PCT/US17/54638, dated Apr. 9, 2020.

* cited by examiner

ELECTROLESS METAL-DEFINED THIN PAD FIRST LEVEL INTERCONNECTS FOR LITHOGRAPHICALLY DEFINED VIAS

CLAIM OF PRIORITY

This Application is a National Stage Entry of, and claims priority to, PCT Application No. PCT/US17/54638, filed on 29 Sep. 2017 and titled "ELECTROLESS METAL-DEFINED THIN PAD FIRST LEVEL INTERCONNECTS FOR LITHOGRAPHICALLY DEFINED VIAS", which is incorporated by reference in its entirety for all purposes.

BACKGROUND

Packaging for microelectronic devices is facing increasing demand for smaller dimensions. This trend is driven by consumer demand for increasing portability of computing devices such as smart phones and laptops. As chip size is able to shrink while maintaining or improving performance, increasingly compact portable devices, such as smart phones and laptops, are introduced on the market each year. Currently, there is an industry-wide trend reduce Integrated Circuit (IC) package dimensions in order to accommodate the trend for ultrathin high performance smart phones, where both package footprint on the circuit board and thickness must be reduced without impacting device performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
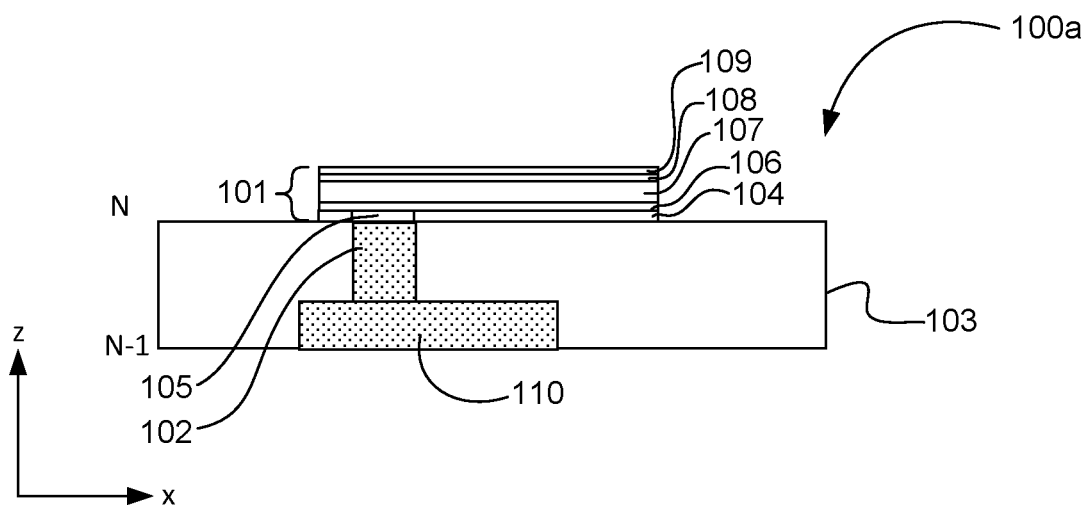
FIG. 1A illustrates a cross-sectional view of package substrate showing a multiple layer thin-profile first level interconnect (FLI) bond pad stack attached to an input-output (I/O) via, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "Bond pad" generally refers to metal pads on a package substrate or on an IC chip die that are accessible for solder bonding. Throughout this specification, "bond pad" refers to metal pads on package substrates for solder bonding IC chips directly to the package substrate.

Here, the term "FLI" refers to "first level interconnect." A FLI pad generally refers to solder bond pads on the first level, or top surface, of an IC package substrate, which is accessible for attaching IC chips by flip chip processes, defined below. Here, the term "First level" refers to the top level or surface of a multilevel package substrate. Here, the term "Multilevel" generally refers to multiple levels of interconnect metallization embedded within a package substrate, where the first level is generally the top surface of the package substrate. The term "first level interconnect" generally refers to bond pads on the top surface of package substrate to which IC chips are solder bonded.

Here, the term "flip chip technology" refers to a surface mount IC package manufacturing process where IC chips are soldered directly to FLI pads on a package substrate. Bond pads on the active surface of the IC chip are aligned with FLI pads on a package substrate top surface by inverting, or "flipping" the IC chip so that the respective bond pads face each other. Solder bumps may be predisposed on the FLI pads or the chip bond pads for chip-to-substrate attachment by a solder reflow process.

Here, the terms "Solder bump" or "bump" generally refers to a ball of solder bonded to a bond pad for further assembly of the die into packages by use of flip-chip mounting of IC dies to a package substrate or interposer, or for leadless surface mounting of IC packages to a circuit board, such as a ball grid array.

"Via" is a term generally referring to columnar metal structures that vertically interconnect conductive layers separated by dielectric layers. Vias are typically embedded in a dielectric matrix such as a motherboard or printed circuit board dielectric or dielectric layers of a build-up package. Vias commonly terminate at both ends in metal layers, either on the surface and connected to surface metallization, or internally in buried interconnection layers of a circuit board or build up package. Vias have cross-sectional dimensions that depend of the power levels they are designed to handle. Smaller cross-sections may be employed to conduct low power (low current density) I/O signals, and larger cross-sections may be employed to conduct larger current densities for power delivery.

Here, the term "dielectric matrix" generally refers to one or more dielectric layers such as a motherboard or printed circuit board dielectric or dielectric layers of a build-up package substrate. Alternatively, the term "dielectric layer" may be used with the same meaning.

In conventional IC package architectures, relatively thick FLI pads (typically 10-30 microns) are necessary because a portion of the copper structure is usually dissolved during solder reflow by diffusion of tin from the solder into the bond pad, destroying integrity of the solder joint. Diffusion of tin from molten solder into copper bond pads and underlying vias may result in leaching of the copper out of those structures. Loss of copper weakens the structures, and may cause disintegration of the FLI pad, compromising the integrity of the solder joint formed. The solder joint may fracture, resulting in an open circuit.

Conventional FLI pads are necessarily thick to prevent tin from consuming the entire pad, and to prevent the infiltration of tin into the underlying via. In conventional package implementations, FLI bond pads extend above the package substrate surface, adding z-height to the package dimensions. In order to reduce package thickness, in some implementations, FLI bond pads may be embedded into the dielectric matrix of the package substrate so that the pad surface is planar with the surface of the dielectric.

In such implementations, exposed copper traces on the top layer of the package substrate that are routed near the embedded contact pads can spread solder during reflow. Solder may flow onto adjacent copper traces, increasing the risk of bridging and impaired device reliability. To circumvent this issue, surface traces are eliminated in some package architectures, and vias are exposed at the package surface for attachment of chips directly to these vias without the benefit of intervening FLI pads, which have a larger bonding surface area than the exposed tops of the vias. Particularly for I/O (input-output) vias, the small contact area of the exposed via surfaces makes it difficult to successfully form robust solder joints, resulting in poor package reliability. It may therefore be desirable to terminate the vias with FLI pads of adequate lateral size. To achieve the goal of producing a thin package profile, thin FLI pads are desirable to have a thin profile, (e.g., less than five microns), while possessing the ability to mitigate tin diffusion into the pad and underlying via during solder reflow.

Described herein are embodiments of a thin-profile FLI bond pad having a barrier layer to prevent diffusion of tin into the thin-profile FLI bond pad. In the embodiments described, the thin-profile FLI pad has thicknesses of less than five microns. Embodiments of the thin-profile FLI pad are formed by electroless metal deposition of multiple metal layers directly onto a via top exposed at the surface of the package substrate and the adjacent dielectric matrix. According to some embodiments, the thin-profile FLI bond pad comprises a stack of two or more metal layers, including a barrier layer to prevent diffusion of tin from molten solder from entering the underlying via. A method is also described for formation of a thin-profile FLI pad directly on an exposed via top and adjacent package dielectric matrix.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Drawings are labeled with axes to indicate the orientation of the figure.

FIG. 1A illustrates a cross-sectional view of package substrate 100a showing a multiple layer thin-profile FLI bond pad stack attached to an I/O via, according to some embodiments of the disclosure.

In FIG. 1A, FLI bond pad stack 101 extends in both the x and z directions from the top of via 102, covering a portion of the top surface (first level, N) of package dielectric matrix 103. Bond stack 101 comprises first layer 104, sublayer 105, second layer 106 and third layer 107, fourth layer 108 and fifth layer 109. In some embodiments, first layer 104 is a catalyst metal layer, and comprises metals including, but not limited to, palladium, silver, iridium, platinum, rhodium, osmium, ruthenium, copper and nickel. In some embodiments, first layer 104 comprises metal nanoparticles. In some embodiments, first layer 104 comprises of palladium nanoparticles attached by surface coordination bonds to dielectric matrix 103 in lithographically defined regions adjacent to via 102 of dielectric matrix 103. In some embodiments, the thickness of first layer 104 ranges between 0.1 and 10 nanometers (0.0001 to 0.01 microns).

Sublayer 105 is disposed over the top of via 102, and is coplanar with layer 104. In some embodiments, sublayer 105 is a catalytic layer for electroless deposition of metals onto the top of via 102. Sublayer 105 comprises metals including, but not limited to, palladium, silver, iridium, platinum, rhodium, osmium, ruthenium, copper and nickel. In some embodiments, sublayer 105 has a thickness that ranges from 0.1 to 1 micron. In some embodiments, sublayer 105 is metallurgically joined to the top of via 102, and is an intermediary layer between via 102 and bond stack 101. In some embodiments, sublayer 105 is an anchor layer for attaching FLI bond pad stack 101 onto via 102 and forming a metallurgical joint there between.

Second layer 106 overlays first layer 104 and sublayer 105, and in some embodiments, is metallurgically joined thereto. In some embodiments, second layer 106 is an anchor layer for bond stack 101 to package substrate 100a. In some embodiments, second layer 106 is anchored to via 102 through sublayer 105, and anchored to dielectric matrix 103 through first layer 104. In some embodiments, second layer 106 comprises copper. In some embodiments, second layer 106 comprises nickel. In some embodiments, second layer 106 has a thickness ranging between 0.1 and 3 microns.

Third layer 107 overlays second layer 106, and comprises metals including, but not limited to, copper, nickel, cobalt, iron, tungsten, and cobalt-tungsten alloys. In some embodiments, third layer 107 is a barrier layer for preventing diffusion of tin from liquid solder into via 102 during chip attachment. In some embodiments, third layer 107 has a thickness ranging between 0.1 and 3 microns.

Fourth layer 108 overlays third layer 107. In some embodiments, fourth layer 108 comprises metals such as, but not limited to, tin, palladium, platinum, silver, and gold. In some embodiments, fourth layer 108 is a capping layer over third layer 107, which in some embodiments is a tin diffusion barrier layer, preventing oxidation of the non-noble and valve metals that may be comprised by third layer 107. In some embodiments, fourth layer 108 is a solder wetting layer comprises a noble metal such as gold or silver, promoting adhesion of solder to FLI bond pad stack 101. In some embodiments, fourth layer 108 has a thickness ranging from 0.01 and 1 micron.

Fifth layer 109 overlays layer 108. In some embodiments, fifth layer 109 comprises gold and silver. In some embodiments, fifth layer 109 is a solder wetting layer to allow liquid solder to substantially cover the surface of FLI bond pad stack 101 in order to form a robust solder joint between bond stack 101 and solder bump. In some embodiments, fifth layer 109 has a thickness ranging from 0.01 to 1 micron.

Via 102 extends from a lower metallization level (e.g., level N−1) comprising metallization 110, to first metallization level N of package substrate 100a. First level N may have exposed conductive trace routing. In some embodiments, via 102 terminates at a bond pad or conductive trace on first level N. In some embodiments, via 102 has a small cross-section for conduction of low power (low current density) I/O signals, and is dedicated to carrying low current density I/O signals. In other embodiments, via 102 has a larger cross-sectional area for conduction of higher current density power supply outputs.

Figure 1B:
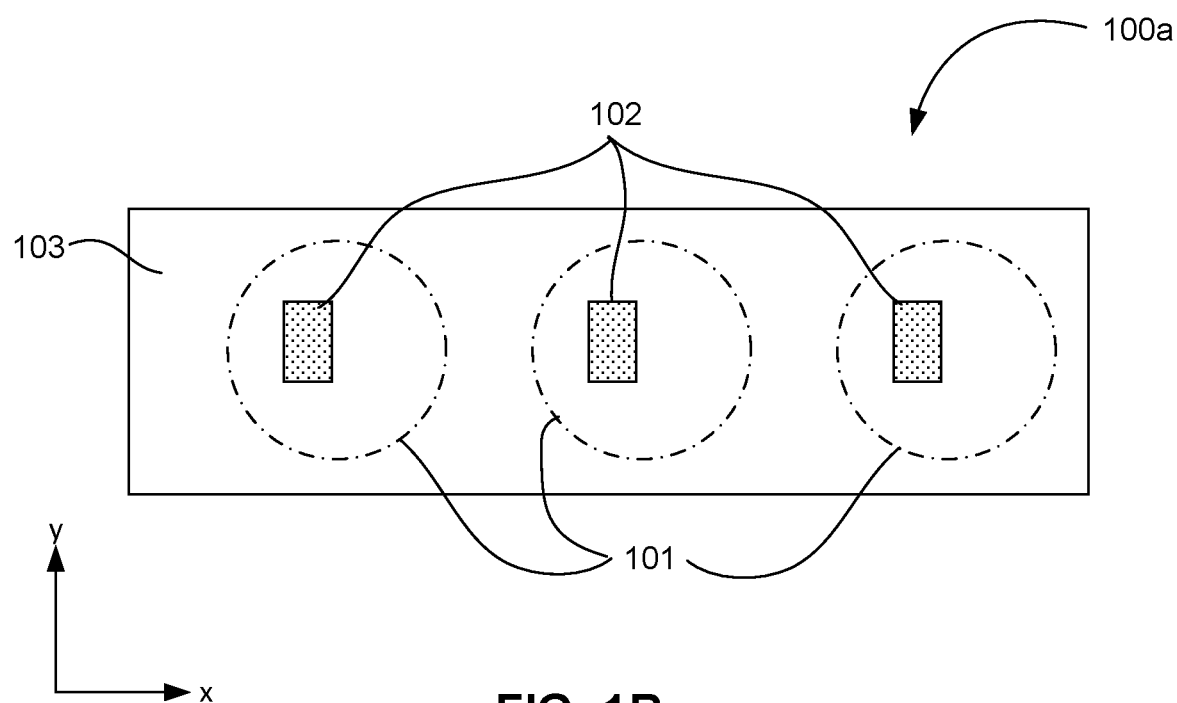
FIG. 1B illustrates a plan view of a package substrate showing an array comprising a thin profile FLI bond pad stack collocated over a via, according to some embodiments of the disclosure.

FIG. 1B illustrates a plan view of package substrate 100a showing an array comprising FLI bond pad stack 101 collocated over via 102, according to some embodiments of the disclosure.

In FIG. 1B, FLI bond pad stack 101 is delineated by phantom outlines to reveal via 102 below. In the illustrated embodiment, via 102 is a lithographically defined via, and has a rectangular cross section. In the illustrated embodiment, FLI bond pad stack 101 has a circular cross section. However, the structures shown in FIG. 1B are not limited to the particular geometries shown, and may be defined by lithographic techniques to have any cross-sectional geometry. Various geometries of via 102 reflect design rules for routing of conductors for particular 3D package architectures. FLI bond pad stack 101 may accommodate any cross-sectional geometries of via 102, and may be collocated in arbitrary ways with via 102 to accommodate 3D package metallization or other package design rules.

In some embodiments, via 102 is attached eccentrically to FLI bond pad stack 101, where the center of FLI bond pad stack 101 is offset from a central vertical axis of via 102, as shown in FIG. 1B. In conventional package architectures, FLI pads may be grown from the tops of via 102 non-lithographically by electroplating or electroless deposition. In these methods, FLI pads can only be centered over the via. Because FLI bond pad stack 101 is lithographically defined over dielectric matrix 103 adjacent to via 102, it can accommodate any geometry and location of via 102, therefore enabling flexible package architectures.

Figure 1C:
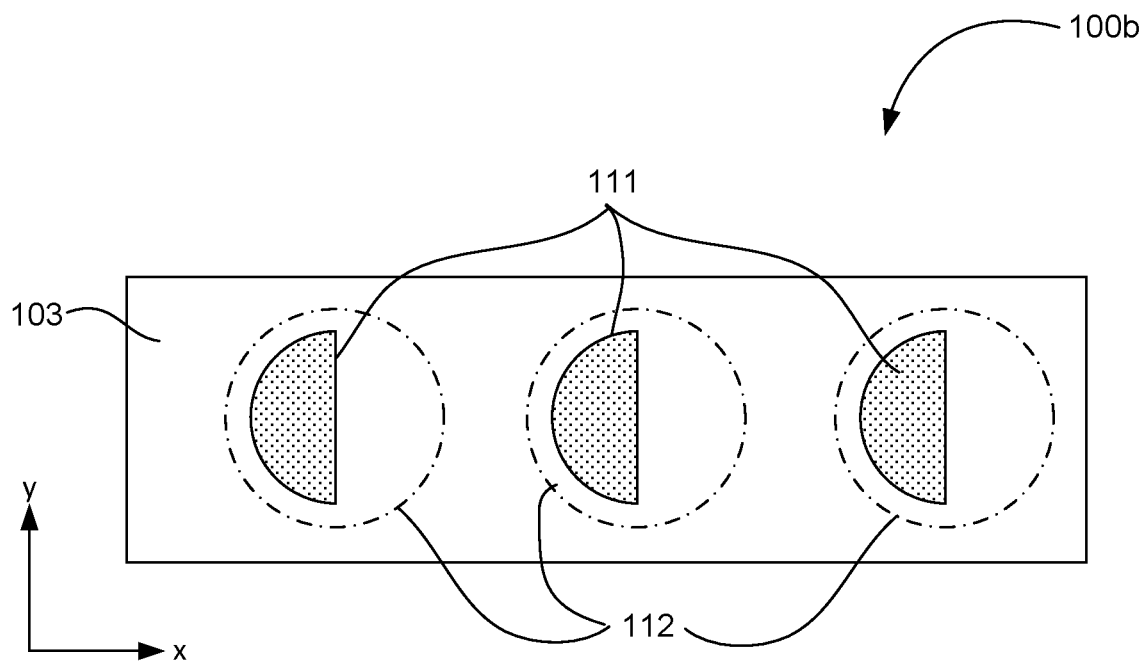
FIG. 1C illustrates a plan view of a package substrate showing an array comprising a thin profile FLI bond pad stack collocated over a power via, according to some embodiments of the disclosure.

FIG. 1C illustrates a plan view of package substrate 100b showing an array comprising FLI bond pad stack 101 collocated over power via 111, according to some embodiments of the disclosure.

In FIG. 1C, bond pad stack 112 (an alternative embodiment of FLI bond pad stack 101) is delineated by phantom outlines to reveal power via 111 below. In some embodiments, power via 111 is a lithographically defined via, and can have arbitrary cross section and form different from via 102, in that power via 111 carries larger current densities for power delivery to attached chips. A larger cross-section is necessary in power via 111 to maintain a low resistance at high current densities, and to minimize Joule heating due to resistive power dissipation. In the illustrated embodiments, power via 111 has a semi-circular cross-section. However, in some embodiments, power via 111 has a circular cross-section. In some embodiments, power via 111 has a rectangular cross section. FLI bond pad stack 112 has a circular cross section in the illustrated embodiment, but is not limited to this geometry. Power via 111 may have arbitrary cross-sectional geometry to accommodate particular package design rules. The thin profile of bond stack 112 (e.g., less than 5 microns) provides a low resistance to current moving through power via 111 to power terminal of an attached IC. In some embodiments, the central axis of power via 111 is offset from the center of FLI bond pad stack 112. Power via 111 may be collocated arbitrarily under FLI bond pad stack 112.

Figure 1D:
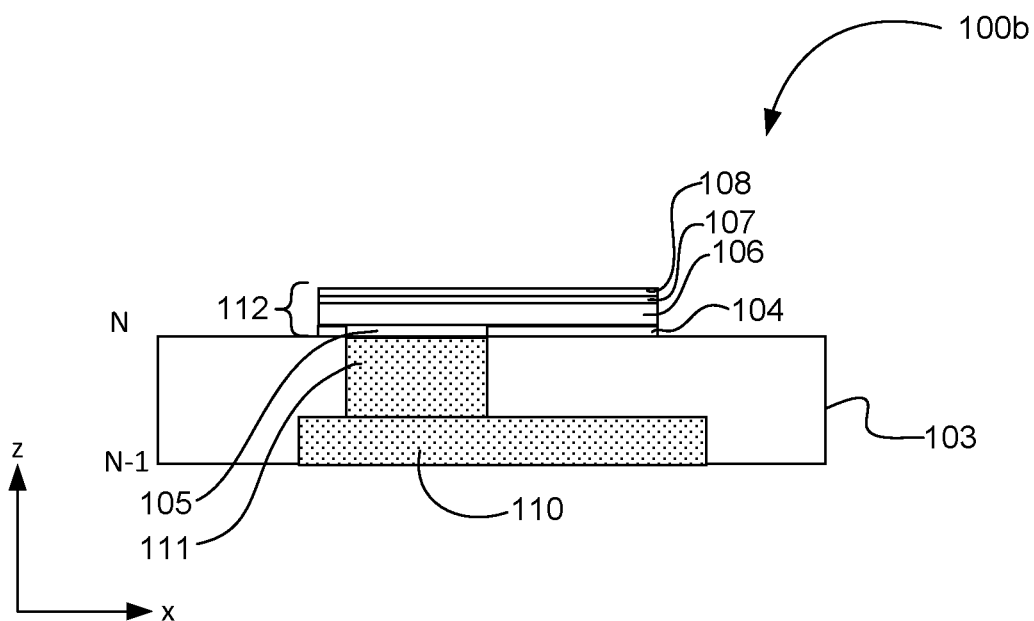
FIG. 1D illustrates a cross-sectional view of a package substrate showing a thin profile FLI bond stack collocated over a power via, according to some embodiments of the disclosure.

FIG. 1D illustrates a cross-sectional view of package substrate 100b showing thin profile FLI bond stack 112 collocated over power via 111, according to some embodiments of the disclosure.

In some embodiments, bond pad stack 112 comprises four layers. In the illustrated embodiment of FIG. 1D, thin-profile FLI bond pad stack 112 comprises first layer 104, sublayer 105, second layer 106, third layer 107, and fourth layer 108. In some embodiments, second layer 106 comprises nickel, in contrast to the embodiments shown in FIGS. 1A and 1B, where second layer 106 comprises copper. In some embodiments, second layer 106 is a nickel anchor layer for attaching thin-profile FLI bond pad stack 101 to underlying via 102 and dielectric 103 (FIG. 1A).

In some embodiments, power via 111 interconnects metallization layer 110 located at level N−1 within (or on the bottom surface of) package substrate 100b, with thin-profile FLI bond pad stack 112 located at level N. In some embodiments, level N coincides with the top surface of package substrate 100b. In some embodiments, level N−1 coincides with the bottom surface of package substrate 100b. In some embodiments metallization layer 110 comprises power routing. In some embodiments, the central axis of power via 111 is offset from the center of thin-profile FLI bond pad stack 112. The arbitrary location of power via 111 relative to thin-profile FLI bond pad stack 112 allows for a greater package design flexibility. As an example, power via 111 is not constrained to be in register with solder bump pitch of a particular chip.

FIGS. 2A-2H illustrate a first exemplary method for fabricating a thin-profile FLI bond pad stack, according to some embodiments of the disclosure.

Figure 2A:
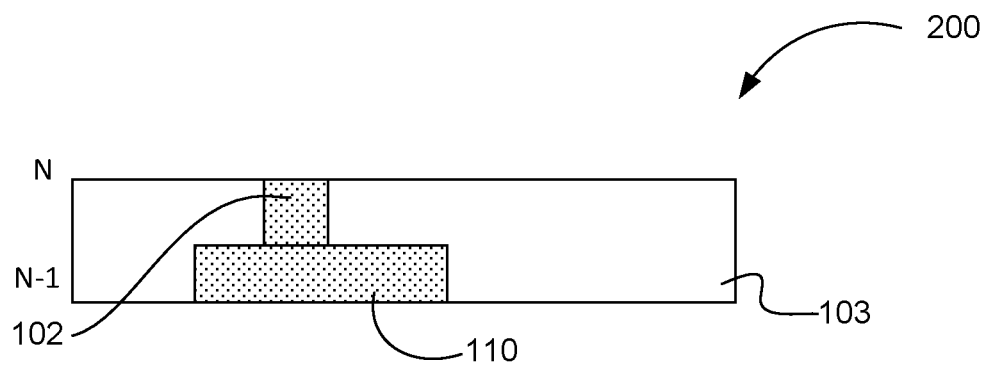
FIGS. 2A-2H illustrate a first exemplary method for fabricating a thin profile FLI bond pad stack, according to some embodiments of the disclosure.

FIG. 2A illustrates a cross-sectional view of package substrate 200 prepared for deposition of a thin-profile FLI bond pad stack in subsequent operations, according to some embodiments of the disclosure.

In some embodiments, the exemplary method comprises receiving a package substrate 200 having via 102 terminating at the top surface (level N). In FIG. 2A, package substrate 200 as received comprises via 102. In some embodiments, via 102 is lithographically defined. In some embodiments, via 102 is formed by through-mask etching of openings in build-up film layers made during package fabrication. An example of an etching process is Deep Reactive Ion Etching (DRIE). Other examples include, but are not limited to, oxygen plasma etching and sputter etching. Openings may expose metallization in conductive layers, such as metallization 110 at level N−1 within package 200. In some embodiments, level N−1 is embedded within package substrate 200. In some embodiments, level N−1 is the bottom layer of package substrate 200.

Lithographically defined openings for via 102 may be filled by deposition of metals such as, but not limited to, copper and copper alloys, aluminum and aluminum alloys, nickel and nickel alloys. Metals may be deposited by electrochemical methods such as, but not limited to, electroplating and electroless deposition. For electroplating, metallization 110 may serve as the cathode upon which via 102 is deposited, forming a metallurgical bond with metallization 110.

Figure 2B:
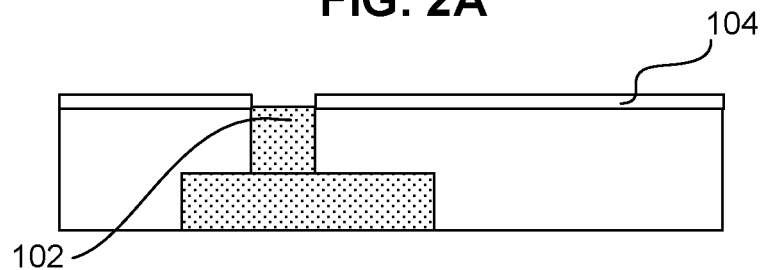

FIG. 2B illustrates a cross-sectional view of package substrate 200 having a catalyst layer deposited over the top surface, according to some embodiments of the disclosure.

In FIG. 2B, catalyst layer 104 is formed on the surface of package substrate 200. In the illustrated embodiments, catalyst layer 104 is first formed by adsorption of ionic precursors of the catalytic metal on the surface of dielectric 103, with a subsequent chemical reduction of the adsorbed ions to form a thin metal layer over the surface of dielectric matrix 103, shown below. A catalyst layer is used to initiate electroless deposition by surface reduction of metal ions in solution phase to deposit initially onto the catalyst layer, then onto the surface of the growing deposition layer. The surface of the growing deposition layer serves as a catalytically active layer to continue more electroless deposition of the metal from solution phase. As an example, catalytic metals such as palladium, platinum and ruthenium are known to exhibit catalytic activity to initiate surface reduction of gold, silver, copper and nickel.

In some embodiments, catalyst layer 104 may be formed by first adsorbing ions of a catalytic metal, such as palladium. Liquid phase techniques dipping of package substrate 200 into aqueous or non-aqueous solutions containing transition metal salts such as $PdCl_2$. Other transition metal ions include, but are not limited to, silver ions, iridium ions, platinum ions, rhodium ions, osmium ions, ruthenium ions, copper ions and nickel ions. In other embodiments, catalyst layer 104 is formed by spin coating a transition metal salt solution. In other embodiments, catalyst layer 104 is formed by spray coating a transition metal salt solution.

In some embodiments, the surface of dielectric 103 comprises polar groups comprising oxygen or nitrogen moieties within the polymer chains of an organic dielectric material, or in the molecules of an inorganic dielectric material. The oxygen and nitrogen moieties may present surface binding sites for coordination of transition metal ions out of the liquid phase and onto dielectric 103. Transition metal ions may adsorb onto coordination sites on the exposed surface of dielectric 103. In some embodiments, coordination sites comprise regions of dielectric 103 oxidized by chemical treatments or by oxygen plasma treatment.

Binding sites may be present in pores of dielectric 103 as well, extending several tens of nanometers below the surface of dielectric 103. In some embodiments, dielectric 103 is subject to an oxygen plasma treatment to form oxygen-containing molecules such as hydroxyl groups, ketones, ethers, epoxies, and carboxylic groups, on the surface by oxidation of the non-polar or hydrophobic surface of dielectric 103.

Catalyst layer 104 may be dried for preparation of subsequent operations. Catalyst layer 104 comprises noble metals, such as palladium, platinum, ruthenium and osmium. Noble metals are not prone to oxidation under most ambient conditions, allowing catalyst layer 104 to remain stable in the dry state. In some embodiments, coordination molecules are present help to stabilize catalyst layer 104 against oxidation. In some embodiments, metal ions or reduced metals can be complexed or coordination with molecules to stabilize catalyst layer 104 against oxidation.

Figure 2C:
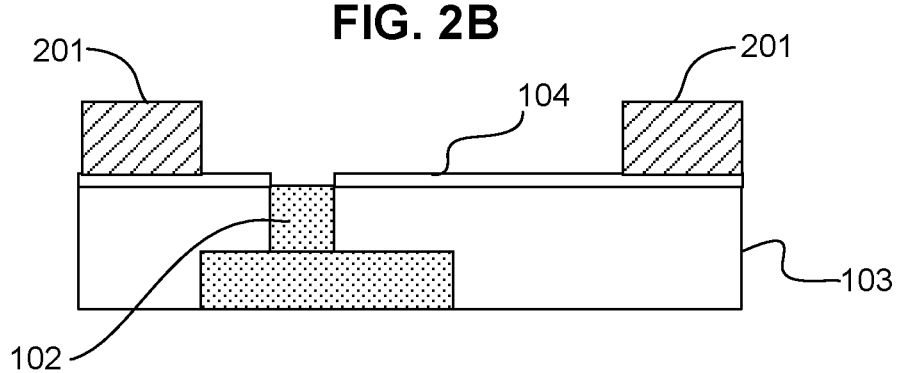

FIG. 2C illustrates a cross-sectional view of package substrate 200 having a patterned photoresist layer deposited on the catalyst layer, according to some embodiments of the disclosure.

In FIG. 2C, photoresist 201 is coated over layer 104 and patterned to form openings surrounding via 102. In some embodiments, photoresist 201 is a thick-film resist. In some embodiments, photoresist 201 has a thickness that ranges between 1 and 10 microns. Photoresist 201 may be coated onto package substrate 200 by techniques including, but not limited to, spin coating, dip coating, spray coating, and/or lamination. In some embodiments, photoresist 201 is coated onto package substrate 200 at the panel or wafer level. Photoresist 201 is to be patterned for lithographic definition of bond pad formation in subsequent operations.

Figure 2D:
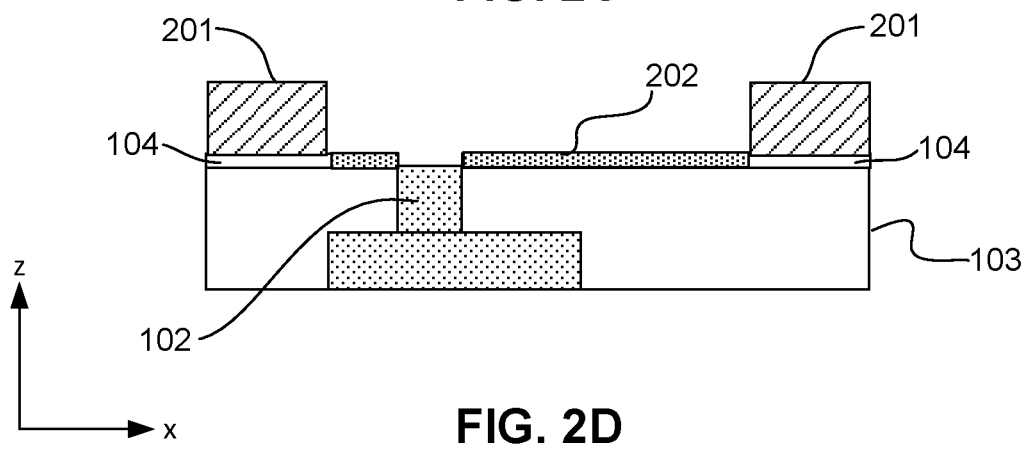

FIG. 2D illustrates a cross-sectional view of package substrate 200 having a layer of reduced noble metal catalyst within openings of the patterned photoresist, according to some embodiments of the disclosure.

In FIG. 2D, adsorbed noble metal ions in catalyst layer 104 are reduced to metal atoms forming reduced region 202 within patterned openings of photoresist 201. In some embodiments, reduced region 202 is an island comprising catalytic metal. In some embodiments, catalyst layer 104 comprises palladium ions (e.g., $Pd^{2+}$). Palladium ions may be reduced to palladium metal (e.g., $Pd^0$) by aqueous phase reduction of $Pd^{2+}$ by a variety of known methods. Other noble metal ions may be similarly reduced to metal. In some embodiments, reduced region 202 comprises nanoparticles of noble metal. In some embodiments, the reduced regions 202 of metallic catalyst are confined to exposed areas of catalyst layer 104 within openings of photoresist 201.

Chemical reduction of transition metal ions such as $Pd^{2+}$ to the metallic state may be performed in liquid phase by treatment with formaldehyde solutions, thiocyanates, ketones, phosphites, sulfites, etc. In some embodiments, reaction temperatures are under 100° C., and in some embodiments less than 50° C. In some embodiments transition metal ions such as $Pd^{2+}$ can be reduced by UV light, lasers, or e-beam in the presence of a reducing agent.

In other embodiments, catalyst layer 104 may be formed by vapor phase deposition of transition metals. In some embodiments, vacuum deposition methods are employed to produce thin films of catalytic metals, such as sputtering techniques and evaporation FIG. 2E illustrates a cross-sectional view of package substrate 200 where the patterned photoresist is stripped to prepare package substrate 200 for subsequent operations, according to some embodiments of the disclosure.

Figure 2E:
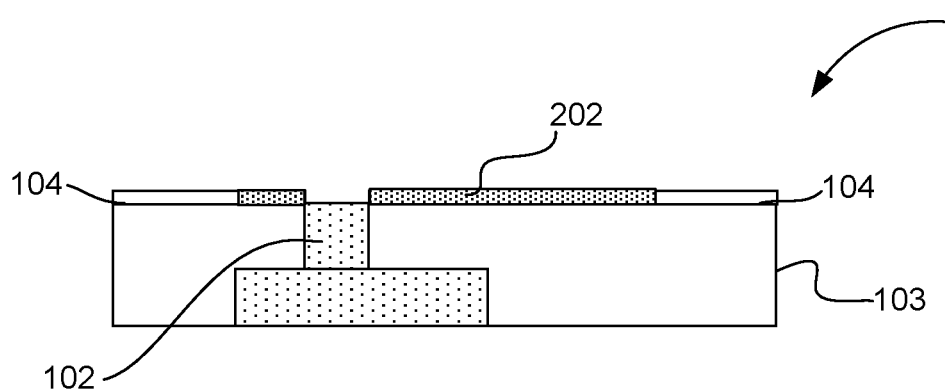

In FIG. 2E, photoresist (201) is stripped, exposing the unreduced portions of catalyst layer 104. Photoresist (201)

comprises resins that may dissolve in electroless plating baths or other solutions in subsequent operations, interfering with the formation of thin-profile FLI bond pad stacks, and is removed to prevent undesired reactions, according to some embodiments. Reduced region 202 of layer 104 surround via 102, and are active for initiation of electroless deposition of metal layers over dielectric 103, according to some embodiments. In some embodiments, reduced regions 202 comprise nanoparticles produced during the reduction reaction.

Figure 2F:
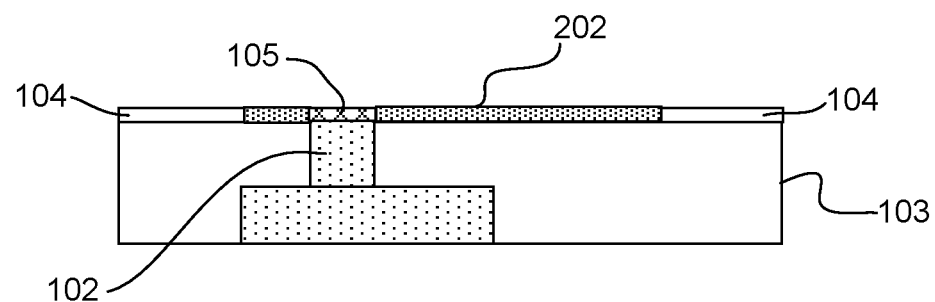

FIG. 2F illustrates a cross-sectional view of package substrate 200 where a catalytic seed layer of noble metal catalyst is formed over the exposed tops of via, according to some embodiments of the disclosure.

As the electroless metal layers are to adhere to the exposed tops of via 102 as well as dielectric 103, a catalyst bed is prepared on the tops of via 102. In some embodiments, a noble metal seed layer is formed on the tops of via 102. In FIG. 2F, sublayer 105 is formed over the top of via 102. Sublayer 105 comprises a layer of metal catalytic for electroless deposition, but differs from reduced regions 202 of layer 104 in that the noble metal is deposited from the ionic state in solution by an metal exchange reaction with the metal composing via 102.

In some embodiments, sublayer 105 has a polycrystalline structure. In some embodiments, sublayer 105 comprises metals such as, but not limited to, palladium, platinum, ruthenium, rhodium, silver, iridium, osmium, copper and nickel. In the metal exchange reaction, metal from the top of via 102 is oxidized and dissolved by noble metal ions in solution phase. The noble metal ions are simultaneously reduced to metal and deposited on the surface. An exemplary exchange reaction between palladium ions ($Pd^{2+}$) and metallic copper is the following. $Pd^{2+}$ reacts with copper at the top of via 102, where copper metal) ($Cu^0$) is oxidized by $Pd^{2+}$ to form $Cu^{2+}$ and $Pd^0$. This reaction is confined to tops of via 102, and does not occur over dielectric material, such as dielectric 103. Sublayer 105 is formed in this manner, according to some embodiments. In some embodiments, sublayer 105 has a thickness that ranges from 1 to 10 nm.

Figure 2G:
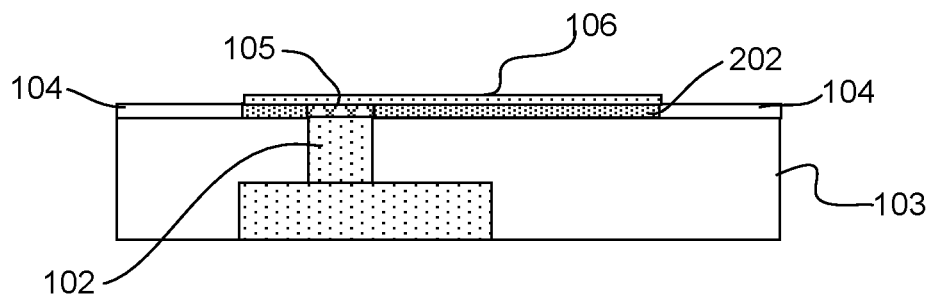

FIG. 2G illustrates a cross-sectional view of package substrate 200 having a metal layers formed by electroless deposition over the reduced catalytic region and on the exposed tops of the via, according to some embodiments of the disclosure.

In FIG. 2G, a first FLI bond pad stack layer (e.g., layer 106, the second layer of the bond pad stack after first layer 104, the catalyst layer) is deposited over reduced region 202 of catalyst layer 104, and sublayer 105. Layer 106 is formed by electroless deposition, according to some embodiments. In some embodiments, layer 106 comprises copper. In some embodiments, layer 106 comprises nickel. In some embodiments, layer 106 is an anchor layer, attaching to the top of via 102 and dielectric 103 by growth of metal layer initiated by catalysis of the surface reduction of metal ions on reduced region 202 of layer 104 and on layer 105. The initial layers of metal will catalyze further electroless deposition, allowing layer 106 to grow to arbitrary thicknesses. However, growth may be confined to the extent of reduced region 202 of layer 104. In some embodiments, growth may be limited to one micron or less as the thickness of layer 106.

Electroless deposition can be performed at room temperature or at temperatures elevated above room temperature. The length of time is determined by deposition kinetics of the particular deposition solution. Electroless deposition methods are well established, and a variety of recipes may be used that are compatible with the materials of package substrate 200. In some embodiments, layer 106 is formed by vacuum deposition techniques, such as DC and RF sputtering techniques, vapor phase deposition such as chemical vapor deposition of metals.

Figure 2H:
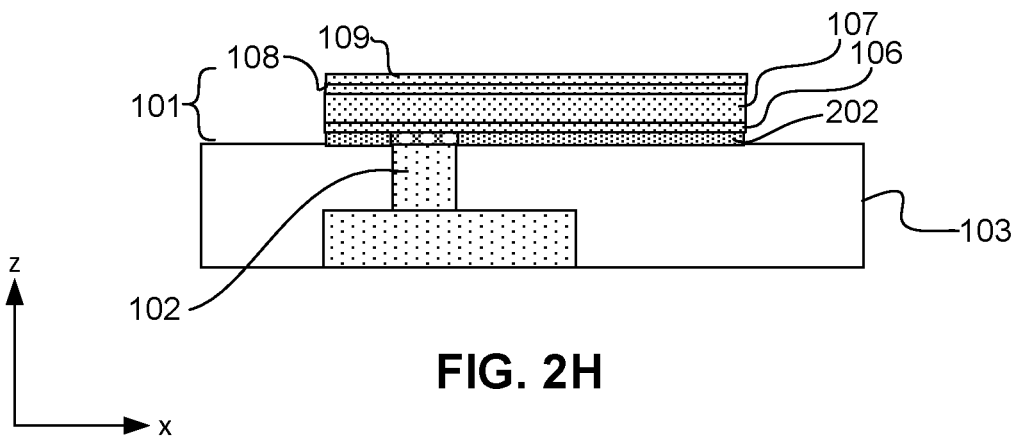

FIG. 2H illustrates a cross-sectional view of package substrate 200 having the catalyst layer of unreduced noble metal ions removed, according to some embodiments of the disclosure.

In FIG. 2H, layer 104, comprising unreduced noble metal ions, is removed from the surface of dielectric 103 adjacent to reduced region 202. Removal of adsorbed unreacted noble metal ions may be necessary to prevent potential contamination of integrated circuits to package substrate 200. In some embodiments, additional metal layers 107, 108 and 109, described above, are deposited over layer 106 in succession. In some embodiments, layer 107 is deposited over layer 106, layer 108 is deposited over layer 107 and layer 109 are deposited over layer 108. Layers 106-109 are shown in FIG. 2H as a complete FLI bond pad stack 101. In some embodiments, bond stack 101 comprises only layers 106-108. In other embodiments, bond stack 101 can have fewer or more layers than illustrated. In this example, bond stack 101 is confined to the geometry reduced region 202, defined lithographically. Layers 107-109 are deposited by electroless deposition techniques. In some embodiments, layers 107-109 are deposited by vacuum deposition techniques, such as DC and RF sputtering techniques, vapor phase deposition such as chemical vapor deposition of metals.

FIGS. 3A-3H illustrate a second exemplary method for fabricating a bond pad stack, according to some embodiments of the disclosure.

Figure 3A:
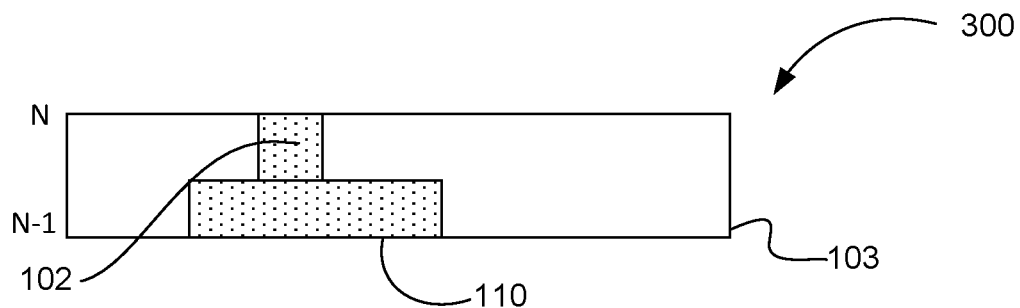
FIGS. 3A-3H illustrate a second exemplary method for fabricating a thin profile FLI bond pad stack, according to some embodiments of the disclosure.

FIG. 3A illustrates a cross-sectional view of package substrate 300 prepared for deposition of bond pad stacks in subsequent operations, according to some embodiments of the disclosure.

In FIG. 3A, package substrate 300 as received comprises via 102 formed by lithographic definition. In some embodiments, via 102 are formed by through-mask etching of openings in build-up film layers during package fabrication. Openings may expose metallization in conductive layers, such as metallization 110 at level N-1 within package substrate 300. In some embodiments, level N-1 is embedded within package substrate 300. In some embodiments, level N-1 is the bottom layer of package substrate 300. An example of an etching process is Deep Reactive Ion Etching (DRIE). Other examples include, but are not limited to, oxygen plasma etching and sputter etching.

Figure 3B:
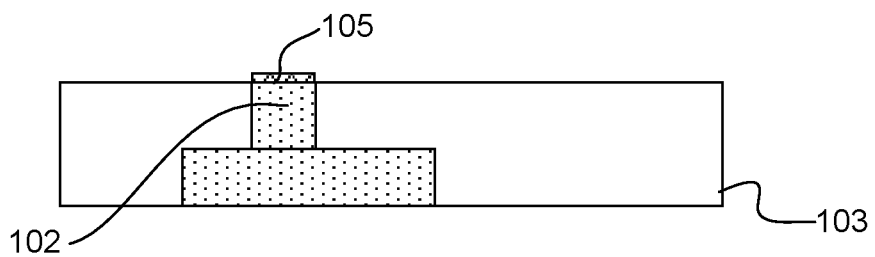

FIG. 3B illustrates a cross-sectional view of package substrate 300 where a catalytic seed layer of noble metal catalyst is formed over the exposed tops of the via, according to some embodiments of the disclosure.

In FIG. 3B, sublayer 105 is formed over the top of via 102. Sublayer 105 comprises a layer of a noble transition metal, which is deposited from the ionic state in solution by a metal exchange reaction with the metal composing via 102, which is copper and alloys of copper, according to some embodiments. The exchange reaction is confined to the copper top of via 102, and does not occur over the dielectric portions of package substrate 300, as the reaction occurs with solid metals having a higher oxidation potential than the noble transition metal in solution. In some embodiments, sublayer 105 has a polycrystalline structure. In some embodiments, sublayer 105 is a catalytic layer for electroless deposition over via 102. In some embodiments, sublayer 105 has a thickness that ranges from 1 to 10 nm.

Figure 3C:
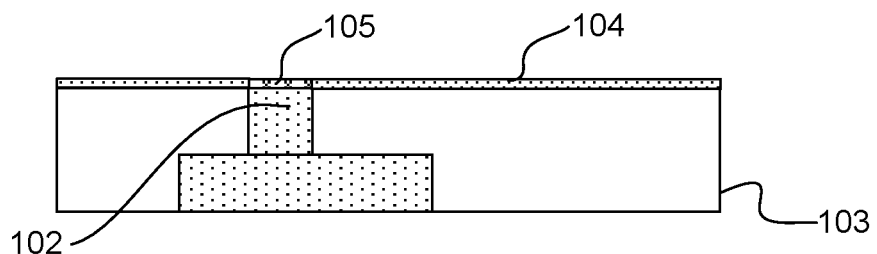

FIG. 3C illustrates a cross-sectional view of package substrate 300 having a catalyst layer deposited over the top surface, according to some embodiments of the disclosure.

In FIG. 3C, catalyst layer 104 is adsorbed on the surface of package substrate 300. In the illustrated embodiments, ionic precursors of catalyst layer 104 are adsorbed on the surface of dielectric 103 and is not adsorbed to the exposed top of via 102.

Catalyst layer 104 may be dried for preparation of subsequent operations. Catalyst layer 104 comprises noble metals, such as palladium, platinum, ruthenium and osmium. Noble metals are not prone to oxidation under most ambient conditions, allowing catalyst layer 104 to remain stable in the dry state. In some embodiments, coordination molecules are present help to stabilize catalyst layer 104 against oxidation.

Figure 3D:
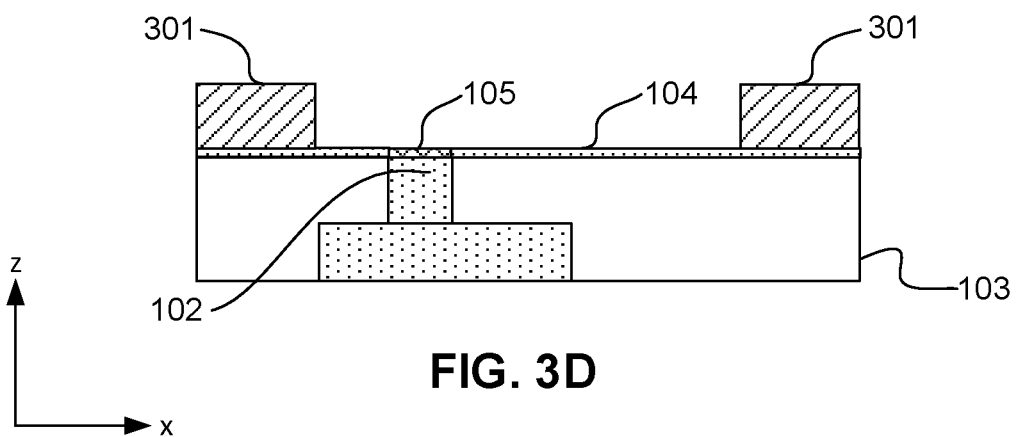

FIG. 3D illustrates a cross-sectional view of package substrate 300 having a patterned photoresist layer deposited on the catalyst layer, according to some embodiments of the disclosure.

In FIG. 3D, photoresist 301 is coated over layer 104 and patterned to form openings surrounding via 102 and sublayer 105. In some embodiments, photoresist 301 is a thick-film resist. In some embodiments, photoresist 301 has a thickness that ranges between 1 and 10 microns. Photoresist 301 may be coated onto package substrate 300 by techniques including, but not limited to, lamination, spin coating, dip coating, and spray coating. In some embodiments, photoresist 301 is coated onto package 300 at the panel or wafer level. Photoresist 301 is patterned for lithographic definition of bond pad formation in subsequent operations.

Figure 3E:
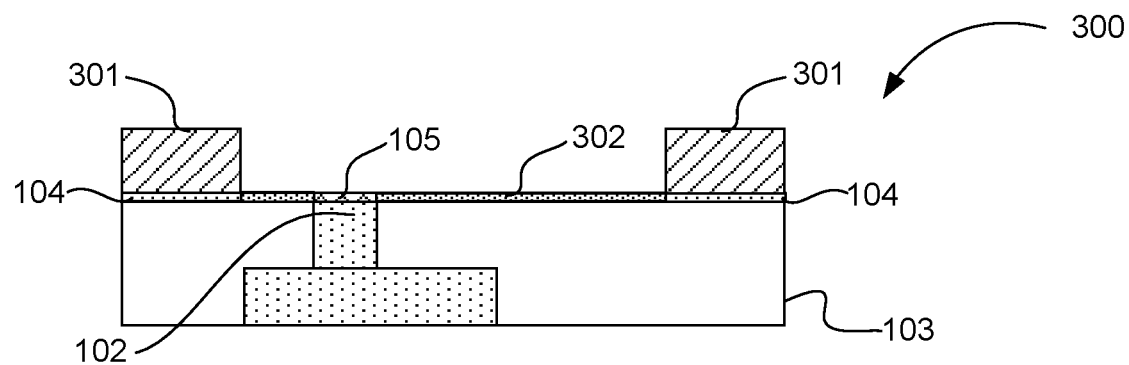

FIG. 3E illustrates a cross-sectional view of package substrate 300 having a layer of reduced noble metal catalyst within openings of the patterned photoresist, according to some embodiments of the disclosure.

In FIG. 3E, adsorbed noble metal ions in layer 104 are reduced to metal atoms forming reduced region 302 within patterned openings of photoresist 301. In some embodiments, layer 104 comprises palladium ions (e.g., $Pd^{2+}$). Palladium ions may be reduced to palladium metal (e.g., $Pd^0$) by aqueous phase reduction of $Pd^{2+}$ by a variety of known methods. Other noble metal ions may be similarly reduced to metal. Nanoparticles of noble metal may be produced and remain bonded at binding sites on the surface of dielectric 103. In some embodiments, the reduced regions 302 of metallic catalyst are confined to exposed areas of catalyst layer 104 within patterned openings of photoresist 301.

Figure 3F:
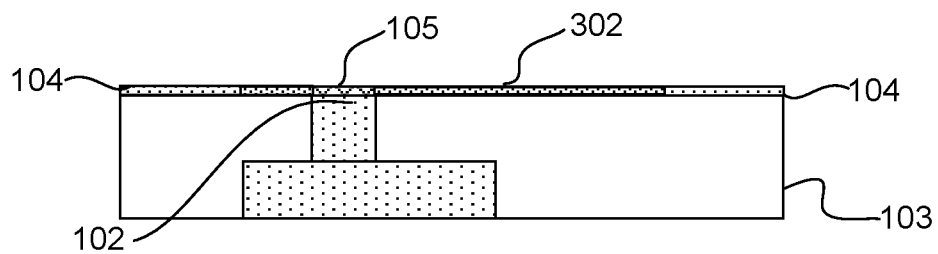

FIG. 3F illustrates a cross-sectional view of package substrate 300 where the patterned photoresist is stripped to prepare package substrate 300 for subsequent operations, according to some embodiments of the disclosure.

In FIG. 3F, photoresist (301) is stripped, exposing the unreduced portions of layer 104. Reduced region 302 of layer 104 surrounds via 102, and is active for initiation of electroless deposition of metal layers over dielectric 103, according to some embodiments. In some embodiments, Photoresist (301) comprises resins that may dissolve in electroless plating baths or other solutions in subsequent operations, interfering with the formation of bond pad stacks, and is removed to prevent undesired reactions, according to some embodiments.

Figure 3G:
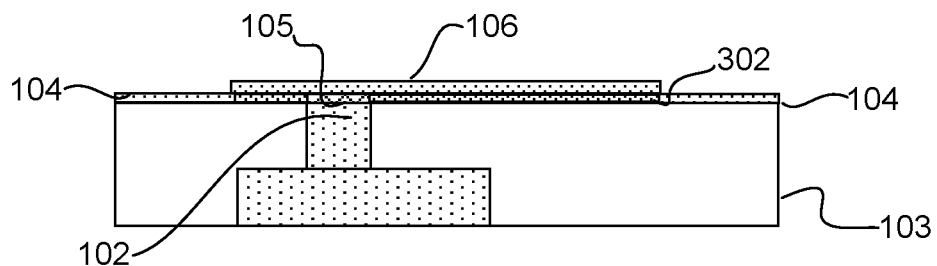

FIG. 3G illustrates a cross-sectional view of package substrate 300 having a metal layer formed by electroless deposition over the reduced catalytic region and on the exposed tops of the via, according to some embodiments of the disclosure.

In FIG. 3G, a first bond pad stack layer (layer 106) is deposited over reduced region 302 of catalyst layer 104, and sublayer 105. Layer 106 is formed by electroless deposition, according to some embodiments. In some embodiments, layer 106 comprises copper. In some embodiments, layer 106 comprises nickel. In some embodiments, layer 106 is an anchor layer, attaching to the top of via 102 and dielectric 103 by growth of metal layer initiated by catalysis of the surface reduction of metal ions on reduced region 302 of layer 104 and on layer 105. The initial layers of metal will catalyze further electroless deposition, allowing layer 106 to grow to arbitrary thicknesses. However, growth is confined to the extent of reduced region 302 of layer 104, which is defined lithographically, according to some embodiments. In some embodiments, growth is limited to one micron or less as the thickness of layer 106.

Electroless deposition is performed at room temperature or at temperatures elevated above room temperature. The length of time may be determined by deposition kinetics of the particular deposition solution. Electroless deposition methods are well established, and a variety of recipes may be used that are compatible with the materials of package substrate 300.

Figure 3H:
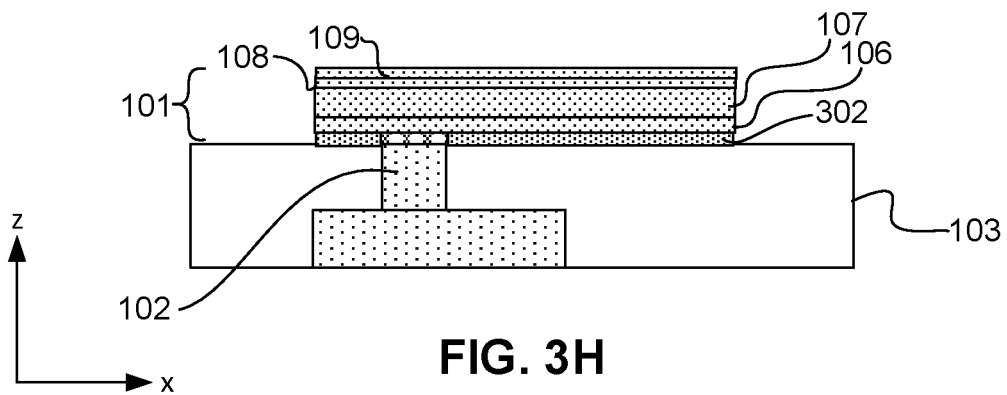

FIG. 3H illustrates a cross-sectional view of package substrate 300 having the catalyst layer of unreduced noble metal ions removed, according to some embodiments of the disclosure.

In FIG. 3H, layer 104, comprising unreduced noble metal ions, is removed from the surface of dielectric 103 adjacent to reduced region 302. Removal of adsorbed unreacted noble metal ions may be performed to prevent potential contamination of integrated circuits to package 300. Additional metal layers 107, 108, and 109, described above, are deposited over layer 106, and are shown in FIG. 3H as a complete FLI bond pad stack 101. Layers 106-109, forming bond stack 101, are confined to the geometry of lithographically defined reduced region 302.

Figure 4:
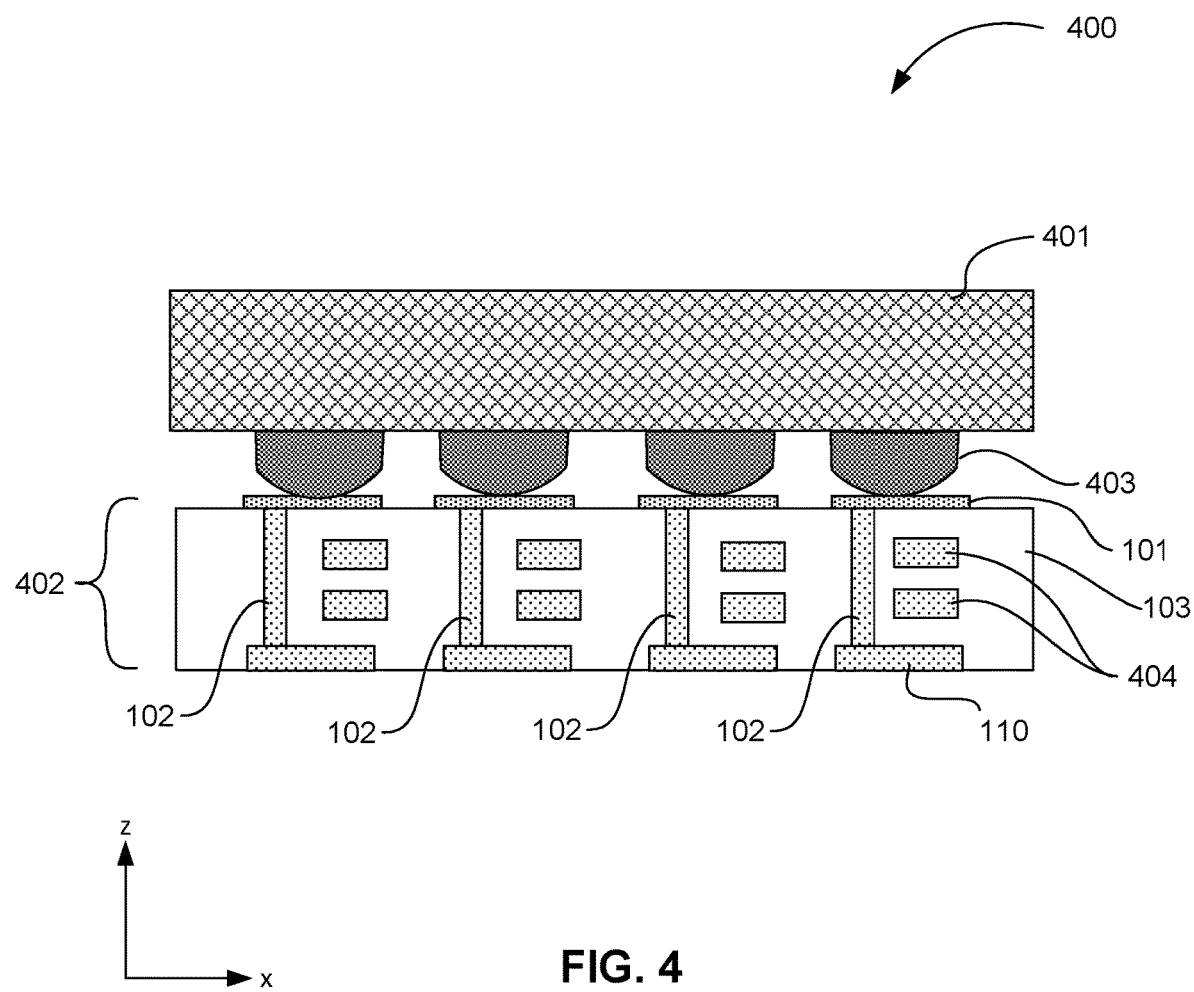
FIG. 4 illustrates a cross-sectional view of package with a chip bonded to thin-profile FLI bond pad stack disposed on the package substrate, according to some embodiments of the disclosure.

FIG. 4 illustrates a cross-sectional view of package 400 with a chip bonded to thin-profile solder bond pads disposed on the package substrate, according to some embodiments of the disclosure.

In FIG. 4, package 400 comprises chip 401 attached to package substrate 402 by solder bumps 403 bonded to thin-profile bond pad stacks 101. Via 102 bridge through dielectric 103 to lower level metallization 110. In some embodiments, via 102 are I/O via. In some embodiments, via 102 are power via. In the illustrated embodiment, via 102 are offset from the center of bond pad stacks 101, accommodating mid-level trace routing metallization 404. Bond pad stacks 101 have dimensions commensurate with the size of solder bumps 403, allowing reliable coupling of signal paths between package substrate 402 and chip 401.

Figure 5:
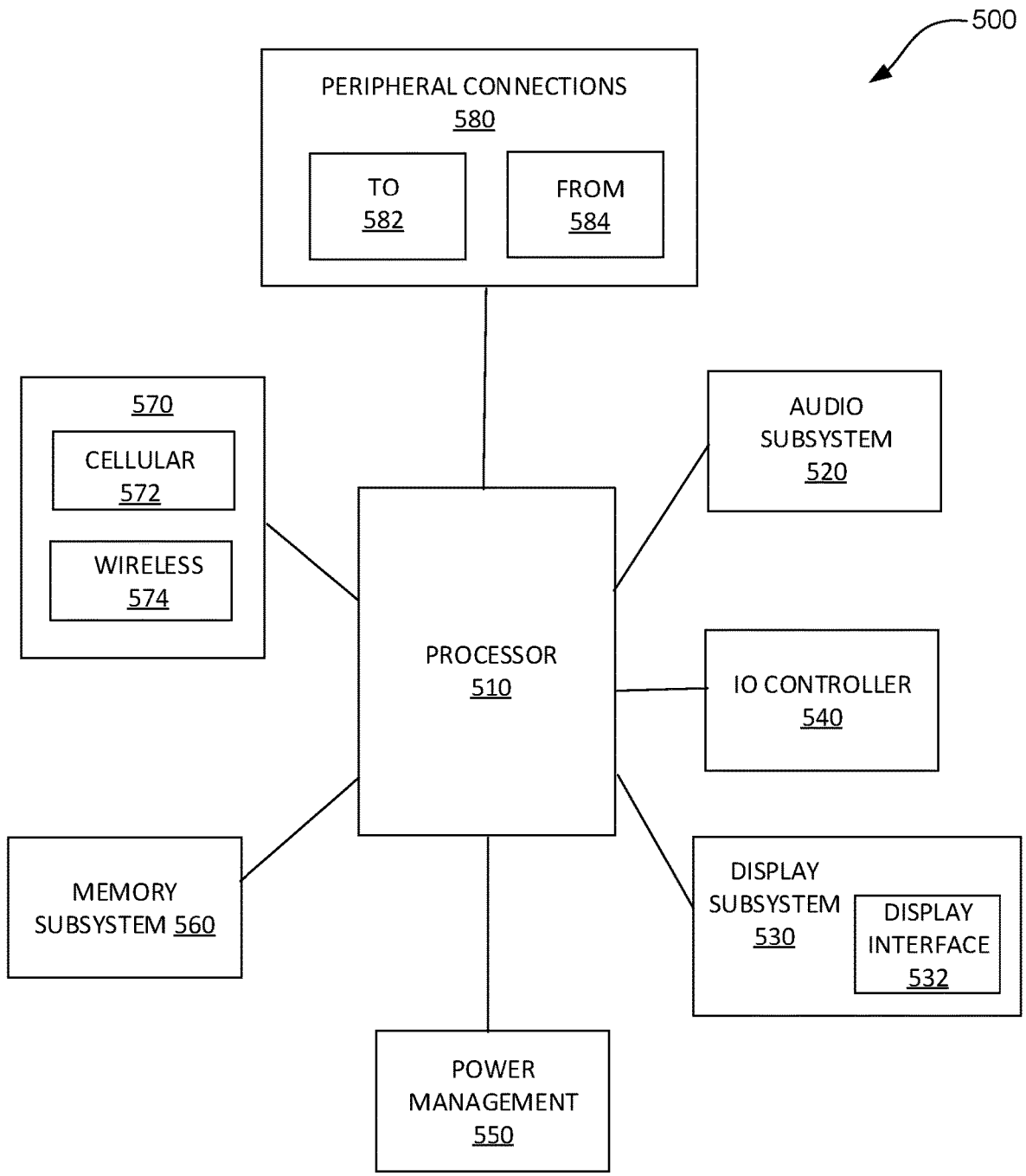
FIG. 5 illustrates a package comprising thin-profile FLI bond pad stacks, connecting multiple dies as part of a system-on-chip (SoC) package in an implementation of a computing device, according to some embodiments of the disclosure.

FIG. 5 illustrates a package (e.g., package 400 in FIG. 4) comprising thin-profile FLI bond pad stacks, connecting multiple dies as part of a system-on-chip (SoC) package in an implementation of computing device 500, according to some embodiments of the disclosure.

FIG. 5 illustrates a block diagram of an embodiment of a mobile device in which flat surface interface connectors could be used. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532 which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Network interface 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking"

connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is a package substrate, comprising a package comprising a substrate, the substrate comprising a dielectric layer, a via extending to a top surface of the dielectric, and a bond pad stack having a central axis and extending laterally from the via over a first layer, the bond pad stack structurally integral with the via, wherein the bond pad stack comprises the first layer comprising a first metal disposed on a top of the via and extends laterally from the top of the via over the top surface of the dielectric layer adjacent to the via, the first layer bonded to the top of the via and the dielectric, a second layer disposed over the first layer, and a third layer disposed over the second layer, the second layer comprises a second metal and the third layer comprises a third metal, wherein the second layer and the third layer are electrically coupled to the via.

Example 2 includes all of the features of example 1, wherein the first metal is one of palladium, platinum, ruthenium, rhodium, silver, iridium, osmium, copper or nickel.

Example 3 includes all of the features of example 1, wherein the second metal is one of copper, nickel, nickel phosphide, cobalt, iron, tungsten, or cobalt-tungsten alloys.

Example 4 includes all of the features of example 1, wherein the third metal is one of tin, palladium, nickel, nickel phosphide, cobalt, iron, tungsten, or cobalt-tungsten alloys.

Example 5 includes all of the features of example 1, wherein the bond pad stack further comprises a fourth layer disposed over the third layer, the fourth layer comprising a fourth metal.

Example 6 includes all of the features of example 5, wherein the fourth metal is one of tin, gold, silver, palladium, platinum, ruthenium, rhodium, iridium, osmium, copper or nickel.

Example 7 includes all of the features of example 1, wherein the bond pad stack further comprises a fifth layer disposed on the fourth layer, the fifth layer comprising a fifth metal.

Example 8 includes all of the features of example 7, wherein the fifth metal is one of gold, silver or copper.

Example 9 includes all of the features of example 1, wherein the bond pad stack has a thickness ranging between 1 micron and 5 microns.

Example 10 includes all of the features of example 1, wherein the first layer has a thickness ranging between 0.1 nanometer and 10 nanometers.

Example 11 includes all of the features of example 1, wherein the second layer has a thickness ranging between 0.1 nanometer and 3 microns.

Example 12 includes all of the features of example 1, wherein the third layer has a thickness ranging between 0.1 micron and 3 microns.

Example 13 includes all of the features of example 5, wherein the fourth layer has a thickness ranging between 0.01 micron and 1 micron.

Example 14 includes all of the features of example 7, wherein the fifth layer has a thickness ranging between 0.01 micron and 1 micron.

Example 15 includes all of the features of example 1, wherein the center of the bond pad stack is offset with the central axis of the via.

Example 16 includes all of the features of example 1, wherein the center of the bond pad stack is coincident with the central axis of the via.

Example 17 is a system, comprising a memory, a processor coupled to the memory, and a system-on-chip, comprising an Integrated Circuit (IC) package comprising a substrate, the substrate comprising a dielectric layer, the dielectric layer having a top surface, a via having a central axis and extends to the top surface of the dielectric layer, and a bond pad stack extends laterally from the via over the first layer, the bond pad stack structurally integral with the via, wherein the bond pad stack comprises a first layer comprising a first metal disposed on the top of the via and extends laterally from the top of the via over the top surface of the dielectric layer adjacent to the via, the first layer bonded to the top of the via and the dielectric layer, a second layer disposed over the first layer, and a third layer disposed over the second layer, the second layer comprises a second metal and the third layer comprises a third metal, the second layer and the third layer are electrically coupled to the via, a wireless interface communicatively coupled to the package, the wireless interface to allow the processor to communicate with another device.

Example 18 includes all of the features of example 17, wherein the system-on-chip is according to any one of claims 2 to 16.

Example 19 is a method comprising receiving a package having a substrate comprising a dielectric and a via extending from a conductive layer within the substrate to a top surface of the dielectric, the via having an exposed top, and forming a bond pad stack attached to the exposed top of the via and extending laterally therefrom over the surface of the dielectric adjacent to the exposed top of the via and attached thereto.

Example 20 includes all of the features of example 19, wherein forming a bond pad stack attached to the exposed top of the via and extending laterally therefrom over the surface of the dielectric adjacent to the exposed top of the via and attached thereto comprises forming a first layer of the bond pad stack comprising a first metal on the exposed top of the via and on the top surface of the dielectric adjacent to the exposed top of the via.

Example 21 includes all of the features of example 19, wherein forming a first layer comprising a first metal on the top surface of the dielectric adjacent to the exposed top of the via comprises absorbing metal ions on the top surface of the dielectric, depositing a photoresist mask over top surface of the dielectric, patterning openings in the photoresist mask, wherein the openings encompass the adsorbed metal ions adsorbed on the top surface of the dielectric adjacent to the exposed top of the via, chemically reducing the metal ions encompassed within the openings in the photoresist mask to form islands comprising the first metal on the top surface of the dielectric, the metal islands surrounding the exposed top of the via; and removing the photoresist mask.

Example 22 includes all of the features of any one of examples 19 through 21, wherein the first metal exhibits catalytic activity for initiation of electroless deposition of copper or nickel.

Example 23 includes all of the features of any one of examples 19 through 21, wherein the first metal is any one of palladium, platinum, ruthenium, rhodium, silver, iridium, osmium, copper and nickel.

Example 24 includes all of the features of example 20, wherein forming a first layer comprising a first metal on the exposed top of the via comprises depositing atoms of the first metal onto the exposed top of the via from solution phase by an exchange reaction with metal atoms from the exposed top of the via.

Example 25 includes all of the features of any one of examples 19 through 24, wherein forming a bond pad stack attached to the exposed top of the via and extending laterally therefrom over the surface of the dielectric adjacent to the exposed top of the via and attached thereto further comprises forming a second layer over islands comprising the first metal and surrounding the exposed tops of the via, the second layer comprising a second metal.

Example 26 includes all of the features of example 25, wherein the second metal is one of copper, nickel, nickel phosphide, cobalt, iron, tungsten and tungsten-cobalt alloys.

Example 27 includes all of the features of examples 25 or 26, wherein forming the second layer over islands comprising the first metal and surrounding the tops of the via comprises growing the second layer by electroless deposition of the second metal over the islands comprising the first metal, or growing the second layer by vacuum deposition of the second metal over the islands comprising the first layer comprising the first metal.

Example 28 includes all of the features of any one of examples 25 through 27, wherein forming a bond pad stack attached to the exposed top of the via and extending laterally therefrom over the surface of the dielectric adjacent to the exposed top of the via and attached thereto further comprises forming a third layer comprising a third metal over the second layer.

Example 29 includes all of the features of example 28, wherein forming the third layer comprising a third metal over the second layer comprises growing the third layer by electroless deposition of the third metal over the islands comprising the first layer comprising the first metal and the second layer comprising the second metal, or growing the third layer by vacuum deposition of the third metal over the islands comprising the first layer comprising the first metal and the second layer comprising the second metal.

Example 30 includes all of the features of examples 28 or 29, wherein the third metal is any one of tin, palladium, nickel, nickel phosphide, cobalt, iron, tungsten and cobalt-tungsten alloys.

Example 31 includes all of the features of any one of examples 28 through 30, wherein forming a bond pad stack attached to the exposed top of the via and extending laterally therefrom over the surface of the dielectric adjacent to the exposed top of the via and attached thereto further comprises forming a fourth layer comprising a fourth metal over the third layer.

Example 32 includes all of the features of example 31, wherein forming a fourth layer comprising a fourth metal over the third layer comprises growing the fourth layer by electroless deposition of the fourth metal over the islands comprising the first layer comprising the first metal, the second layer comprising the second metal and the third layer comprising the third metal, or growing the fourth layer by vacuum deposition of the fourth metal over the islands comprising the first layer comprising the first metal, the second layer comprising the second metal, and the third layer comprising the third metal.

Example 33 includes all of the features of examples 31 or 32, wherein the fourth metal is any one of tin, gold, silver, palladium, platinum, ruthenium, rhodium, iridium, osmium, copper or nickel.

Example 34 includes all features of any one of examples 31 through 33, wherein forming a bond pad stack attached to the exposed top of the via and extending laterally therefrom over the surface of the dielectric adjacent to the exposed top of the via and attached thereto further comprises forming a fifth layer comprising a fifth metal over the fourth layer.

Example 35 includes all of the features of example 34, wherein forming a fifth layer comprising a fifth metal over the fourth layer comprises growing the fifth layer by electroless deposition of the fifth metal over the islands comprising the first layer comprising the first metal, the second layer comprising the second metal, the third layer comprising the third metal and the fourth layer comprising the fourth metal, or growing the fourth layer by vacuum deposition of the fourth metal over the islands comprising the first layer comprising the first metal, the second layer comprising the second metal, the third layer comprising the third metal, and the fourth layer comprising the fourth metal.

Example 36 includes all of the features of any one of examples 19 through 35, wherein forming the bond pad stack attached to the exposed top of the via and extending laterally therefrom over the surface of the dielectric adjacent to the exposed top of the via and attached thereto comprises forming the bond pad stack in such a way that the center of the bond pad stack is offset from the central axis of the via.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package substrate, comprising:
    a metal via extending to a top surface of a dielectric layer; and
    a bond pad stack in contact with the metal via, wherein the bond pad stack comprises a plurality of collocated layers having a shared central axis and extending laterally from the via over the dielectric layer, the collocated layers of the bond pad stack comprising:
        a first layer comprising a reduced noble metal, a first portion of the reduced noble metal in contact with the metal via and a second portion of the reduced noble metal extending laterally from the metal via over the dielectric layer adjacent to the metal via, wherein a top of the metal via immediately adjacent the first portion of the reduced noble metal comprises oxidized metal;
        a second layer over the first layer, the second layer comprising a second metal; and
        a third layer over the second layer, the third layer comprising a third metal, wherein the central axis of the collocated layers of the bond pad stack is offset from a central axis of the metal via.

2. The package substrate of claim 1, wherein the reduced noble metal comprises at least one of palladium, platinum or ruthenium.

3. The package substrate of claim 1, wherein the reduced noble metal comprises palladium.

4. The package substrate of claim 1, wherein the second metal comprises at least one of copper, nickel, nickel phosphide, cobalt, iron, tungsten, or cobalt-tungsten alloys.

5. The package substrate of claim 1, wherein the third metal comprises at least one of tin, palladium, nickel, nickel phosphide, cobalt, iron, tungsten, or cobalt-tungsten alloy.

6. The package substrate of claim 1, wherein the bond pad stack further comprises a fourth layer over the third layer, the fourth layer comprising a fourth metal comprising at least one of tin, gold, silver, palladium, platinum, ruthenium, rhodium, iridium, osmium, copper, or nickel.

7. The package substrate of claim 6, wherein the bond pad stack further comprises a fifth layer over the fourth layer, the fifth layer comprising a fifth metal comprising at least one of gold, silver, or copper.

8. The package substrate of claim 1, wherein the bond pad stack has a thickness less than 5 microns.

9. The package substrate of claim 8, wherein the first layer has a thickness between 0.1 nanometer and 10 nanometers, the second layer has a thickness between 0.1 micron and 3 microns, and the third layer has a thickness between 0.1 micron and 3 microns.

10. The package substrate of claim 9, wherein the bond pad stack further comprises a fourth layer over the third layer and a fifth layer over the fourth layer, the fourth layer having a thickness between 0.01 micron and 1 micron, and the fifth layer having a thickness between 0.01 micron and 1 micron.

11. A computer system, comprising:
    a memory; and
    a processor coupled to the memory, wherein at least one of the memory and processor are in an Integrated Circuit (IC) package, and wherein the IC package comprises the IC package substrate of claim 1.

* * * * *